United States Patent [19]

Sachi

[11] Patent Number: 4,666,817
[45] Date of Patent: May 19, 1987

[54] PRESENSITIZED DIAZO COLOR-PROOFING SHEET WITH PARTICULAR SIZED PIGMENTS

[75] Inventor: Leonard W. Sachi, Oakdale, Minn.

[73] Assignee: Minnesota Mining and Manufacturing Company, St. Paul, Minn.

[21] Appl. No.: 814,649

[22] Filed: Dec. 30, 1985

[51] Int. Cl.$^4$ .................. G03C 1/60; G03C 1/74
[52] U.S. Cl. ................... 430/160; 430/143; 430/157; 430/158; 430/162; 430/175; 430/293; 430/358; 430/257
[58] Field of Search ............. 430/175, 160, 162, 157, 430/158, 143, 293, 358, 257

[56] References Cited

U.S. PATENT DOCUMENTS

| | | | |
|---|---|---|---|
| 3,136,637 | 6/1984 | Larson | 96/75 |
| 3,671,236 | 6/1972 | Van Beusekom | 96/15 |
| 3,721,557 | 3/1970 | Inoue | 430/143 |
| 4,472,494 | 9/1984 | Hollmann et al. | 430/143 |
| 4,482,625 | 11/1984 | Namiki et al. | 430/143 |
| 4,561,899 | 12/1985 | Matrick | 428/204 |

FOREIGN PATENT DOCUMENTS 1313777  4/1973  United Kingdom ............... 430/140

*Primary Examiner*—Charles L. Bowers, Jr.
*Attorney, Agent, or Firm*—Donald M. Sell; James A. Smith; Mark A. Litman

[57] ABSTRACT

A light-sensitive color-proofing sheet is described for producing an image on various substrates. A light-sensitive continuous color layer is releasably attached to a carrier. Overlaying the color layer is a water-insoluble transparent colorless barrier layer. On the opposite surface of the barrier layer is a thermally laminable adhesive layer. Upon lamination of the sheet to a substrate, removal of the carrier and exposure to actinic radiation, the color layer is formed into an image, photomechanically, by removal of the non-image areas.

22 Claims, No Drawings

PRESENSITIZED DIAZO COLOR-PROOFING SHEET WITH PARTICULAR SIZED PIGMENTS

BACKGROUND OF THE INVENTION

1. Field of the Invention

The present invention relates to the photomechanical production of multi-color images in a single sheet or substrate without printing. The invention has particular application in the proofing of color separation negatives preparatory to multi-color lithographic reproduction.

2. Description of the Prior Art

In printing pictorial matter, whether by lithography, letterpress or gravure, the half tone process is used, wherein the actual printing image is composed of thousands of minute dots per square inch of a single color ink of varied dot size or ink density. What the naked eye sees as shading in half tone prints is actually a controlled variation in the size of dots relative to the unprinted areas between the dots. In black and white pictorial matter the dots are printed in black ink only. Full color reproductions, however, are necessarily printed in each of at least three colors, cyan, magenta, and yellow (known as "three color process"), or in these same colors with the addition of black ("four color process"). For each color a separate printing plate is made. In order to make the three or four printing plates, the original color picture or photograph is "separated" photographically, with the use of filters, masks, etc., into a set of three or four half-tone negatives, each representing one of the colors, and containing, dot for dot, the amount of that color which must be printed to produce the desired total color print.

The preparation of the color-separation negative is an art and requires considerable skill in handling the many variables to produce a desired result. Often trial and error is involved requiring correction or replacement of one or more of the negatives. Unless some reliable system is available to "proof" the negatives, the printing press must be set up and copy printed just to secure preliminary proofs. This is time consuming and expensive. It is therefore desirable to provide accurate means for proofing the negatives without printing.

One system for proofing color separation negatives is disclosed in U.S. Pat. No. 3,136,637. A light-sensitive transparent sheet is provided for each of the colors to be printed. Each of the sheets is exposed through its respective color separation negative. Upon processing, the color in the non-image areas is removed, yielding a sheet which contains the desired color pattern in the image areas, while being colorless and transparent in the non-image areas (e.g., between halftone dots). After each of the separate sheets is made, they are assembled together in registry on a white background, whereupon a color proof results.

That system of color proofing has a number of inherent drawbacks. For example, the laying up of the multiplicity of sheets requires that the viewer look through a plurality (three or four) of transparent films during the proofing operation. Since the composite is made of several separate sheets, extreme care is required to maintain registry. If the individual sheets are not perfectly colorless and transparent in the optical sense, any "haze" or imperfection present is multiplied in the several sheets. Additionally, incident light reflects from the several sheets imparting a gloss which is not truly representative of printed copy, thus introducing a need for interpretation in evaluating the proof.

U.S. Pat. No. 3,671,236 improves upon the proofing system described in U.S. Pat. No. 3,136,637. Photomechanically produced images corresponding with each color are integrally built up on a single substrate (much as occurs in the actual printing operation itself) without any printing operations. The multiplicity of carrier films is eliminated by transferring individual color images from a sheet comprised of (1) a carrier with release surface, (2) pigment and binder layer, (3) photohardenable or insolubilizable layer, (4) barrier layer and (5) pressure-sensitive adhesive layer.

U.S. patent application Ser. No. 764,246, filed Aug. 9, 1985 discloses an imaging system similar to that described in U.S. Pat. No. 3,671,236 except that a thermal adhesive with specific properties is used in place of the pressure-sensitive adhesive.

BRIEF DESCRIPTION OF THE INVENTION

The present invention relates to a photosensitive article particularly useful in the generation of photomechanical proofs which comprises at least a carrier with a release surface, a pigment and binder layer, a photohardenable layer, characterized by the presence of pigments which absorb radiation at the wavelength of sensitivity of said photohardenable layer. An organic polymeric solvent soluble barrier layer and a thermally laminable adhesive layer are preferably used with the system. The pigment and binder layer may be combined with the photohardenable layer.

DETAILED DESCRIPTION OF THE INVENTION

Photosensitive color proofing sheets, for each of the four colors used in proofs, tend to be sensitive to a single range of imaging radiation so that each of the color proofs can be imaged in a single exposure apparatus having a single, relatively narrow band light source. The light source of choice for most color proofing systems has been ultraviolet radiation. This poses a particular problem in color proofing where one of the layers must provide a yellow image. Yellow dyes absorb infrared radiation; and when present within the photosensitive layer or between the photosensitive layer and the ultraviolet radiation light source, the exposure time is greatly increased or the speed can be reduced to such a level that realistic exposure times cannot be accomplished. The optical density of the yellow pigment cannot be reduced to allow more ultraviolet radiation through since a reflectance optical density of at least 0.6 is needed to provide useful optical densities for the color proofing function.

Fine color pigment particles, used in concentration sufficient to provide a reflectance optical density of at least 1.0, essentially filter out all ultraviolet radiation pigment. Larger pigments can provide an essentially continuous optical density of at least 1.0 in the pigment binder layer and allow sufficient radiation to pass between the particles to expose the interstitial photohardenable binder or the underlayer of photohardenable material. However, the very size of the particles causes another undesirable problem which is a color shift towards the red wavelengths. This color shift is caused by internal reflections within the binder of the larger surfaces of the pigment particle.

The present invention has found that a pigment binder layer having a particular size distribution can provide not only the desirable penetrability (transmissivity) for the actinic radiation, but can also surprisingly provide a given optical density with lower total weight amounts of pigment than either small particle pigment compositions or large particle pigment compositions.

To perform in the practice of the present invention, the particle size distribution of the pigment must be chosen with respect to the sensitivity of the photosensitive material. As ultraviolet radiation is the radiation of choice in the exposure of color proofing materials most preferred in the practice of the present invention, the particle size distribution should be chosen so as to minimize scattering of that actinic radiation. Thus for example, with a system sensitive to 380 nm, it is required that less than 40% by volume of all pigment particles in or above that layer have a particle size which is within 175 nm of the wavelength of sensitivity and that at least 15% or 25% by volume of particles be larger and at least 15% or 25% by volume of particles be smaller by at least 20 nm than the wavelength of sensitivity. Preferably at least 25% by volume of particles are at least 25 nm larger than the wavelength of maximum sensitivity and 25% by volume of particles are at least 25 nm smaller than the wavelength of maximum sensitivity. In this particular example of 380 nm, this would mean that less than 40% by volume of pigment particles would have a size within the range of 355–405 nm (0.355 to 0.405 microns). Preferably less than 40% by volume of all pigment particles would have a size within 50 nm of the wavelength of maximum sensitivity. Most preferably, less than 25% by volume of all pigment particles would have a size within 50 nm of the wavelength of maximum sensitivity. With respect to absolute sizes, when working with ultraviolet radiation sensitive systems, it is desired to have less than 40% by volume of particle sizes within the range of 0.3 to 0.4 microns (geometric mean diameter), preferably 0.3 to 0.42 microns, and most preferably between 0.25 and 0.42 microns. More preferably it is desired to have less than 25% by volume of pigment particles within that range.

The exact mechanism by which the benefits of the present invention are accomplished are not fully understood, but it is believed to relate to light scattering by particles. It is known that the efficiency of light-scattering is related to the relative size of particles and the wavelength of light. The closer the dimensions of particles are to the wavelength of incident radiation, the greater the scattering effect. A side effect of scattering is effectively increasing the path length of light through the layer. If light is scattered more through an absorptive layer, more light will be absorbed. Thus the present invention uses particles which are primarily or predominantly outside the size of the wavelength of actinic radiation to minimize scattering and absorption. This theory is not controlling and has been developed to attempt to explain the phenomenon which was not predictable from the combination of particle sizes.

Particle size measurements may be made by many convenient and conventional methods. Even fully constructed imaging materials may be analyzed by normal methods. One convenient method is to dissolve the layer containing the pigment particles in an appropriate solvent, thus removing the particles and binder from the article. The binder is in solution already, but further dilution with the same or different solvent will facilitate the measurement of particle size by statistical or mechanical means such as a sedimentation particle counter (e.g., APA 500 by Horiba). Prior to inclusion in a layer, the particles may be milled along with the resin binder in a diluted form (with solvent), coated and then dried so that a statistical measurement of particle size distribution can be made.

The type of color proofing structures that can most benefit from the practice of the present invention must have in order at least: (1) a carrier with a release surface, (2) a pigment and binder layer, and (3) a photohardenable or insolubilizable layer or (1) a carrier with a release surface, and (2) a combined pigment, binder, photohardenable layer. A system having the pigment and binder between the carrier and the photohardenable layer does not benefit from practice of the present invention except for the benefit of the reduced coating weight of pigment. The preferred constructions are those described in U.S. Pat. No. 3,671,236 and U.S. patent application Ser. No. 764,246, filed Aug. 9, 1985, in which the color proofing sheet comprises (1) a carrier with release surface, (2) a pigment and binder layer, (3) a photohardenable or insolubilizable layer, (4) a barrier layer, and (5) a pressure-sensitive or thermal adhesive layer.

The use of a thermally laminable adhesive layer rather than a pressure-sensitive adhesive layer offers the opportunity for some advantages. A thermally adhesive layer can be positioned and repositioned (before lamination) without a chance of altering the receptor surface or picking up extraneous matter as can occur with pressure-sensitive adhesive layers. The physical nature of the smooth, transparent and optically clear thermally laminable adhesive layer offers better optical qualities than the less physically smooth pressure-sensitive adhesive layer.

In attempting to substitute a thermally laminable adhesive layer for the pressure-sensitive adhesive layer of U.S. Pat. No. 3,671,236, significant problems were encountered. Amongst the problems encountered were (1) yellowing of the adhesive layer when exposed to actinic radiation, particularly ultraviolet radiation, during imaging of the proof, (2) self-lamination of thermal adhesive during storage at 45° C. and 2 grams/cm$^2$ pressure, (3) excessive laminating temperatures which deteriorated the sensitometric properties of the photohardenable layer, (4) and ingredients in the thermal adhesive layer that were fugitive and migrated through the barrier layer to disturb the sensitometry of the photohardenable layer, the color of the pigment containing layer and the optical properties of other layers. Many adhesives also would not adhere to the receptor sheet or the barrier layer.

It has been found critical to the use of thermally laminable adhesive layers of photomechanical proofing articles that the following properties be provided by the thermal adhesive layer:

(1) the adhesive layer be thermally laminable at a temperature between 100° and 150° C. at a pressure of 1.6 lb/in$^2$ (0.29 kg/cm$^2$), (2) the adhesive layer is non-tacky at room temperature or preferably not laminable to paper or self-laminable at 45° C., 2 g/cm$^2$, for at least one week, (3) will not discolor or alter its optical density by more than 0.05 optical density units when an area of 15,000 cm$^2$ is exposed to a 5 kilowatt source of ultraviolet radiation having a majority of the radiation distributed over the range of 350 and 450 nm, at a distance of 1 meter for 2 minutes, and (4) have no ingredients which by themselves or in combination with the solvent of the adhesive layer migrate across the barrier layer and desensitize the photohardenable layer, alter the color or tone of the pigments, or alter the optical qualities of the barrier or photosensitive layer.

The adhesive layer must also strongly adhere to the barrier layer, the bond strength between those layers exceeding the mild bond strength between the release layer and either the pigment containing binder layer or the carrier layer.

The property described above for non-coloration reflects conditions of conventional imagewise exposure for the article. Thus the element should not discolor or alter its optical density by as much as 0.05 optical density units (at any wavelength) when subjected to the conventional levels of exposure required to image the diazo resin. Exposure at 417 nm is conventional in industry at present (that is, an exposing radiation having a peak output at about 417 nm), but any other wavelength for maximum output is acceptable. The sheet should not discolor when exposed to sufficient radiation to enable an image to be developed from activation of the diazo resin.

The construction according to the present invention would typically comprise a carrier sheet provided with a release surface, which may either be a smooth surface of the carrier itself, or a surface coating thereon. Overlying the surface and in intimate clinging engagement therewith, but not adhesively bonded thereto, is a color coating comprising, for example, a pigmented organophilic water-insoluble solvent-softenable resinous polymer. Coated over and in contact with the color coating is a light-sensitive diazo resin layer. The color coating and light-sensitive layer are intimately associated and adherently bonded together (and in certain constructions can actually be combined to a single layer). The light-sensitive layer is soluble in a solution which softens and/or partially dissolves the color coating.

Overlying the light-sensitive layer is a continuous solvent-resistant resinous protective film or barrier layer. To the exposed surface of the barrier layer is applied a layer of thermally laminable adhesive. Preferably the adhesive layer is from $0.1 \times 10^{-4}$ cm to $20 \times 10^{-4}$ cm in thickness. The outer surface of the adhesive can optionally be protected from contamination by dirt or grease, by a protective release liner.

In applying that structure to a substrate, such as white paper, the protective liner is first stripped from the adhesive surface and the entire structure is laminated for example, by heated rolling, onto the substrate. Thereafter, the carrier sheet is stripped from the structure, the bond to the paper and the adhesion between the several layers being greater than the non-adhesive clinging engagement between the carrier sheet and the color coating or the release layer. Following the removal of the carrier, the remaining structure, now bonded to the substrate, is exposed to ultraviolet light through the appropriate color separation negative corresponding with the color of the particular coating. In the light struck areas, the ultraviolet light passes through the color coating (which is transparent thereto) and exposes and insolubilizes the light-sensitive material. A firm bond between the light reacted material and the under and overlapping coatings occurs. Adjacent unexposed areas remain light-sensitive.

Thereafter the sheet is processed with processing solvent selected with respect to the particular material of which the color coating layer is composed (and which contains a solvent for the unexposed diazo), to develop the image. The color coating and the sensitizer in the non-light struck areas is removed, leaving the color image anchored to the underlying barrier layer by the light-reacted diazo in exposed areas. During processing, the barrier layer serves as a barrier which protects the substrate (and adhesive) from solutions used during the processing.

The preferred thermal adhesive system has been found to be limited to a narrow class of available thermal adhesives. Only acrylate polymer and copolymer thermal adhesives with a laminating temperature of 100° to 150° C. at a pressure of 0.29 kg/cm² for 5–10 seconds have been found to fulfill all thermal adhesive requirements. Polymers of n-butyl acrylate, ethyl acrylate, isopropyl acrylate and their copolymers with ethylenically unsaturated monomers such as other acrylates, acrylic anhydride, acrylic acid, methacrylic acid, styrene, vinyl acetate, and the like are the only adhesives that fulfill all essential thermal adhesive requirements. Monomers which cause yellowing or discoloring of the final adhesive composition when a sheet (e.g., 15,000 cm²) is exposed to a source of 5 kw ultraviolet radiation having a peak at about 417 nm at 1 meter for two minutes must be avoided. Any change in the optical density of 0.1 and even 0.05 is considered intolerable discoloration. Copolymerizable ethylenically unsaturated materials such a acrylonitrile, vinylidene chloride, and vinyl chloride tend to cause yellowing and must be used, if used at all in an amount less than 10% and preferably less than 5% of the total dry weight of components in the adhesive. Preferred compositions include poly(n-butyl acrylate/ethyl acrylate) (60/40), poly-(ethyl acrylate/styrene) (64/36), poly(n-butylacrylate), poly(styrene/n-butylacrylate/acrylic acid/acrylonitrile) (45/45/8/2), and poly(n-butyl acrylate/vinyl acetate) (80/20).

Many other thermal adhesive systems were attempted, but all others failed for various reasons.

Following the above-described photomechanical production of the first color image on the substrate, for example cyan (blue), similar sheets but containing the yellow, magenta and black color coatings are successively applied to yield a four color proof.

These and other aspects of the invention will now be illustrated in the following non-limiting examples:

EXAMPLES 1–13

A 2-mil film of smooth-surfaced biaxially oriented polyethylene terephthalate polyester is first coated with a polyvinyl alcohol solution constituted as follows:

|  | Parts by wt. |
|---|---|
| Polyvinyl alcohol (available commercially as Gelvatol 20-30/Gelvatol 20:90 (3/1)) | 2.5 |
| Glycerin | 0.5 |
| Water | 97 |

A dry coating weight of 75 mg/ft² provides a satisfactory release layer. The release layer surface is oven dried and then overcoated with a resin solution containing a suitable transparent yellow pigment.

The coating solution is prepared by first dispersing the pigment into 1,1,2-trichloroethane solvent, and adding polyvinylformal resin (Formvar 15/95 E), the amount of the ingredients being adjusted to yield a mix having 65 parts resin, 35 parts pigment, and 900 parts solvent. This mix is appropriately milled. The resultant mill base is then diluted by adding further solvent to yield approximately a 3 percent solids. This pigmented-resin coating solution or dispersion is applied over the dried release layer at a dry coating weight of about 20-70 milligrams per square foot. The coated sheet construction is oven dried as before to evaporate the solvent.

The polyvinyl formal coated side of the sheet is then primed by a corona discharge treatment, sufficient to render the surface of the film water-wettable.

A solution of a light-sensitive diazo resin or equivalent is then coated over the primed surface of the sheet. A preferred diazo resin is the condensation product of p-diazodiphenylamine and formaldehyde, prepared, for example, in accordance with the method described in U.S. Pat. No. 2,714,066. A solution of the pure diazo resin, for example, 4 parts resin dissolved in 48 parts water and 12 parts methanol, is made up.

The preparations of the light-sensitive diazo resin are carried out under subdued light, for example, under a yellow light. This is also true of the other operations involving the coating of the sheet with the light-sensitive resin and subsequent handling of the sensitized sheet prior to exposure and development.

The solution of the light-sensitive diazo resin just described may be applied over the primed polyvinylformal layer by roll-coating or by dipping the sheet into the solution of the resin. It is preferred that the diazo coating be thin, a residue of about 6-8 milligrams of the diazo resin per square foot of area being satisfactory, although the precise amount is not particularly critical with amounts of 3-50 mg/ft$^2$ being useful. The sheet is then air dried at room temperature, or at slightly elevated temperatures if desired. A barrier is applied over the diazo layer, for example, by coating a two percent weight solution in methyl ethyl ketone of a 3:1 weight ratio of poly acrylate ("Elvacite 2044") and a polyvinyl chloride-acetate copolymer ("Vinylite VAGH") at a dry coating weight of 160 mg/ft$^2$ (generally a coating weight of 100-400 mg/ft$^2$ is preferred).

A clear colorless thermally laminable adhesive is coated on the acrylate surface at a dry coating weight of 800 mg/ft$^2$. Following drying, a protective liner of polyethylene coated paper is not necessary but may be placed against the adhesive to facilitate handling of the sheet and to protect the adhesive from dirt, etc. In this form the light-sensitive sheet can then be converted into standard sizes, packed in suitable light-proof containers and shipped in commerce. The adhesive may be coated in much greater quantities, a general range being from about 100 to 1200 mg/ft$^2$.

In the following examples, a poly(n-butylacrylate/ethylacrylate) (60/40) copolymer was used as the thermal adhesive.

Samples of several ratios of a yellow pigment having an average particle size of 0.51 microns [AAOA] and a yellow pigment having an average particle size of 0.11 microns [AAOT] were Meyer bar coated to give a density of 1.08 using the blue filter position of a reflection densitometer (X-rite). These coated samples were sequentially used as optical filters with a step tablet to expose cyan negative Color Key ™. After processing, the relative exposure durations were noted and the number of exposure units to create two solid steps for each ratio of pigments were calculated and shows a 50% reduction in exposure time. It is surprising that such a small quantity of the AAOT opaque pigment (10%) could reduce the exposure time by a factor of 2.

In order to better understand this phenomena, transmission data for some of these samples were measured with the relative photosensitivity of the diazo present in the cyan Color Key ™ and with the transmission data for a blue status T filter. These data show the large difference in energy transmission for the two pigments; for example, 100% AAOA transmits less than 0.1% of the U.V. energy at 380 nm, whereas 100% AAOT transmits about 25% of the same energy. The intermediate values (75% AAOA-25% AAOT) of course shows an intermediate transmission. To further analyze these data, transmission data was converted to absorbance.

The current working assumption that the effect is caused by the scattering of light in the visible region to give more effective covering power ("extend") of the pigment is upheld. It is believed that it can reduce transmission in the visible region and yet effectively increase transmission in the U.V. as evidenced by shorter exposures because the wavelengths of the different radiations are differentially affected by the particle sizes.

The following data show the large effect on transparency and small effect on hue.

| Pigment Composition | | Reflection Density X-Rite Densitometer | | | Transparency X-Rite Densitometer |
|---|---|---|---|---|---|
| AAOA | AAOT | R | G | B | G |
| 100 | 0 | .16 | .20 | .95 | 1.89 |
| 99 | 1 | .16 | .19 | .96 | 1.85 |
| 98 | 2 | .16 | .20 | .96 | 1.74 |
| 95 | 5 | .15 | .19 | .94 | 1.69 |
| 90 | 10 | .16 | .19 | .95 | 1.49 |
| 75 | 25 | .17 | .19 | .98 | 1.27 |
| 50 | 50 | .15 | .19 | .96 | 1.06 |
| 0 | 100 | .15 | .20 | .95 | 0.79 |

Some economic benefits from this invention include: (1) access to a wider range of pigments, (2) reducing the coating weight of the pigment, and (3) altering the hue of the pigment to achieve color control.

In the foregoing illustration, a yellow color proofing sheet is described. The companion magenta, cyan and black structures (which, together with the yellow sheet, constitute a complete four-color proofing system) are similarly prepared employing the same polyvinylformal resin coating, but incorporating appropriately colored and sized pigments, for example, "Watchung Red RT 761-D," "Monastral Blue BT 284-D" (a phthalocyanine pigment), and Cabot "Regal 300 R" carbon black. Pigments are selected and pigment/resin ratios established generally to provide the same color density as would from the printing ink of corresponding color being used on the job being proofed. The sheets can be stored in sensitized condition, and then used weeks or months later as successfully as immediately following manufacture. In using the sheets in producing a color proof composite, any desired substrate can be used.

In preparing a color proof composite, the colors are processed individually and consecutively. A sheet of the color represented by the first negative to be proofed, for example yellow is prepared for processing by removing the adhesive protective sheet and laminating the color sheet to the backing sheet. Pressure applied by conventional laminating apparatus with a heated roller is sufficient to achieve lamination through the thermally laminable adhesive. Following lamination the support sheet of polyethylene terephthalate is stripped away. The light-sensitive layer now on the backing sheet is contact exposed through the corresponding color separation negative.

The light-imaged backing is then physically developed with a solution of normal propanol-water in a 1:1 volume ratio, brushing and wiping with a soft cloth pad to remove the pigmented resin and unexposed sensitizer layers from the non-image (unexposed) areas to leave the latter clear and colorless. Thereby an image is defined, faithfully representing the reproduction and full color range which would result if the complete platemaking and printing operation (using appropriately matched ink), were carried through with that color separation negative.

A sheet of the second color to be proofed, preferably magenta, is prepared in the same way by removing the adhesive protective sheet and laminating it to the yellow imaged backing sheet. The corresponding color separation negative must now be positioned in exact register with the yellow image. This is commonly provided for by a preregistration of all the separation negatives and the backing sheet by a system of register marks or punches. The light-sensitive layer now on the yellow-imaged backing sheet is exposed and processed, as for the first color. The remaining cyan and black images are thereafter added, in turn, thus faithfully reproducing the four color result which would occur in printing, were printing plates employed prepared from the same color separation negatives.

Certain necessary relationships exist between the elements of the construction just described. Adhesive relationships must be such that, after adhesive lamination to the backing sheet, the release layer will allow stripping away the carrier layer without disrupting the adhesive bond. Failure must not occur at either the adhesive-backing sheet or adhesive-barrier layer bonds. While it is not particularly critical whether release occurs between carrier-layer-release layer or release layer-color layer, release is generally less efficient between two in situ formed layers, resulting in somewhat more likely release between carrier layer and release layer. In this event, it is of importance that the release layer be transparent and soluble in the developing solution.

With regard to the selection of the resin of the color coat and to the solution used to develop the image, reference is again made to U.S. Pat. No. 3,136,637, where numerous organophilic hydrophobic water-insoluble solvent-softenable resinous polymers are disclosed, along with suitable developing solutions. It is therein discussed that upon light-exposure of the structure, a firm in situ bond is formed between the resin and the diazo in the light-struck areas, while permitting the resin to be removed upon light rubbing treatment with the appropriate developing solution. The present invention avails itself of these principles.

Inasmuch as the light-sensitive layer is extremely thin and discontinuous, the color coat and the barrier layer contact one another in the structure and their interrelation is important. The bond formed between them (or any intermixing occurring at the interface) must not be such as to prevent the color coat from being removed in the non-light struck areas during development. As indicated above, whatever natural bond exists is strengthened in situ upon light reaction of the diazo to give a strong bond preventing removal in those areas upon development. It has been found that the desired relation is present where at least a degree of physical incompatability exists between the resins comprising the color and barrier layers.

During the coating operations, best results are obtained where a later applied layer is cast from a solvent which does not dissolve prior layers.

In the preceding example, the color coating and the diazo resin were applied in separate steps from different solvents.

I claim:

1. A presensitized color-proofing sheet comprising a carrier sheet having a release surface, a continuous color coating of pigmented organophilic hydrophobic water-insoluble resinous polymer softenable and/or partially dissolvable in a solvent developing medium, said color coating being in intimate clinging engagement with but not adhesively bonded to said release surface, a photosensitive diazo resin soluble in said solvent developing medium directly associated with said color coating, and a barrier layer over said diazo resin directly associated with said color coating, said directly association being at least one of the following:
    (a) the incorporation of said diazo resin in the color coating to form a single layer; and
    (b) the incorporation of said diazo resin in a layer separate but contiguous to the color
    coating layer, and between said color coating
    layer and said carrier sheet, the diazo resin becoming insolubilized and firmly bonding said color layer to said barrier layer in the light-struck areas upon light exposure of said sheet, the color layer and diazo resin being readily removable from said barrier layer in areas not light exposed and over said color coating layer, an adhesive layer, said color coating layer having pigments which absorb radiation to which the diazo resin is sensitive, the particles of said pigment in said color coating layer being characterized by the fact that fewer than 40% of the pigment particles have a size within 175 nm of the wavelength of maximum sensitivity of said photosensitive diazo resin and at least 15% by volume of said pigment particles are larger than said wavelength of maximum sensitivity by at least 15% by volume of said pigment particles are smaller than said wavelength of maximum sensitivity by at least 20 nm.

2. The presensitized sheet of claim 1 wherein the coloring coating and the diazo resin are contiguous layers.

3. The presensitized sheet of claim 1 wherein the color coating and the photo-sensitive diazo resin are intermixed in a single layer.

4. The presensitized sheet of claim 1 wherein said color coating comprises a pigmented polyvinyl formal resin.

5. The presensitized sheet of claim 2 wherein a release liner is bonded to said adhesive layer.

6. The presensitized sheet of claim 1 wherein said acrylic polymer or copolymer comprises poly(n-butyl acrylate) or a copolymer of n-butyl acrylate.

7. The presensitized sheet of claim 1 wherein said acrylic polymer or copolymer comprises poly(ethyl acrylate) or a copolymer of ethyl acrylate.

8. The presensitized sheet of claim 2 wherein said acrylic polymer or copolymer comprises poly(n-butyl acrylate) or a copolymer of n-butyl acrylate.

9. The presensitized sheet of claim 3 wherein said acrylic polymer or copolymer comprises poly(n-butyl acrylate) or a copolymer of n-butyl acrylate.

10. The presensitized sheet of claim 1 wherein said pigments are yellow.

11. The presensitized sheet of claim 1 wherein said pigments are yellow and less than 40% by volume of said pigments are within 50 nm in size of the wavelength of maximum sensitivity of said photosensitive diazo resin.

12. The presensitized sheet of claim 2 wherein said pigments are yellow.

13. The presensitized sheet of claim 2 wherein said pigments are yellow and less than 40% by volume of said pigments are within 50 nm in size of the wavelength of maximum sensitivity of said photosensitive diazo resin.

14. The presensitized sheet of claim 1 wherein said thermal adhesive comprises a copolymer derived from at least one acrylate selected from the group consisting of n-butyl acrylate and ethyl acrylate and at least ethylenically unsaturated monomer selected from the group consisting of styrene, acrylic acid, methacrylic acid, acrylic anhydride, and vinyl acetate.

15. The presensitized sheet of claim 11 wherein said thermal adhesive comprises a copolymer derived from at least one acrylate selected from the group consisting of n-butyl acrylate and ethyl acrylate and at least ethylenically unsaturated monomer selected from the group consisting of styrene, acrylic acid, methacrylic acid, acrylic anhydride, and vinyl acetate.

16. The presensitized sheet of claim 12 wherein said thermal adhesive comprises a copolymer derived from at least one acrylate selected from the group consisting of n-butyl acrylate and ethyl acrylate and at least ethylenically unsaturated monomer selected from the group consisting of styrene, acrylic acid, methacrylic acid, acrylic anhydride, and vinyl acetate.

17. The presensitized sheet of claim 13 wherein said thermal adhesive comprises a copolymer derived from at least one acrylate selected from the group consisting of n-butyl acrylate and ethyl acrylate and at least ethylenically unsaturated monomer selected from the group consisting of styrene, acrylic acid, methacrylic acid, acrylic anhydride, and vinyl acetate.

18. The presensitized sheet of claim 1 wherein said pigments are yellow pigments, said photosensitive diazo resin is sensitive to radiation within the range of 300 to 400 nm, and the particle size distribution of said pigments is such that fewer than 40% by volume of said pigment particles have a size between 0.25 and 0.42 microns.

19. A presensitized color-proofing sheet comprising a carrier sheet having a release surface, a continuous color coating of pigmented organophilic hydrophobic water-insoluble resinous polymer softenable and/or partially dissolvable in a solvent developing medium, said color coating being in intimate clinging engagement with but not adhesively bonded to said release surface, a light-sensitive diazo resin soluble in said solvent developing medium directly associated with said color coating, said direct association being at least one of the following:
(a) the incorporation of said diazo resin in the color coating to form a single layer; and
(b) the incorporation of said diazo resin in a layer separate but contiguous to the color coating layer, a continuous, water-insoluble, transparent, colorless barrier layer bonded on one surface over said color coating and said diazo resin, said barrier layer being insoluble in said solvent developing medium, the diazo resin becoming insolubilized and firmly bonding said color layer to said barrier layer in the light-struck areas upon light exposure of said sheet, the color layer and diazo resin being readily removable from said barrier layer in areas not light exposed and over said barrier layer a thermally-laminable adhesive layer consisting essentially of a layer of at least one acrylic polymer or copolymer which is laminable at a temperature between 100° and 150° at a pressure of 0.29 kg/cm² in 10 seconds, non-tacky at room temperature, will not discolor or alter its optical density by as much as 0.05 optical density units when an area of 15,000 cm² is exposed to 5 kilowatts of ultraviolet radiation having a majority of the radiation distributed over the range of 350 and 450 nm at a distance of 1 meter for 2 minutes, and have no ingredients capable of migrating through said barrier layer and desensitizing said diazo resin, discoloring said pigment, or distorting the optical properties of the other layers, the particles of said pigment in said color coating layer being characterized by the fact that fewer than 40% of the pigment particles have a size within 175 nm of the wavelength of maximum sensitivity of said photosensitive diazo resin and at least 25% by volume of said pigment particles are larger than said wavelength of maximum senstivity and at least 25% by volume of said pigment particles are smaller than said wavelength of maximum sensitivity by at least 25 nm.

20. The presensitized sheet of claim 19 wherein said polymer or copolymer comprises poly(n-butyl acrylate) or a copolymer thereof, poly(ethyl acrylate) or a copolymer thereof and ethylenically unsaturated comonomers or selected from the group consisting of styrene, acrylic acid, methacrylic acid, acrylic anhydride, and vinyl acetate.

21. The presensitized sheet of claim 19 wherein the coloring sheet and the diazo resin are contiguous layers and said pigment is yellow.

22. The presensitized sheet of claim 19 wherein the color coating and the light-sensitive diazo resin are intermixed in a single layer and said pigment is yellow.

* * * * *